US006850065B1

(12) United States Patent
Fujita et al.

(10) Patent No.: US 6,850,065 B1
(45) Date of Patent: Feb. 1, 2005

(54) MRI COIL SYSTEM FOR BREAST IMAGING

(75) Inventors: Hiroyuki Fujita, Highland Heights, OH (US); Mark Xueming Zou, Aurora, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/205,794

(22) Filed: Jul. 26, 2002

Related U.S. Application Data

(60) Provisional application No. 60/308,455, filed on Jul. 27, 2001.

(51) Int. Cl.[7] .................................................. G01V 3/00
(52) U.S. Cl. ...................................................... 324/318
(58) Field of Search ................................ 324/307, 309, 324/318, 322, 328; 600/410, 422; 333/219

(56) References Cited

U.S. PATENT DOCUMENTS

| | | | | |
|---|---|---|---|---|
| 4,712,068 A | * | 12/1987 | Savelainen | 324/318 |
| 5,363,845 A | | 11/1994 | Chowdhury et al. | |
| 5,386,447 A | | 1/1995 | Siczek | |
| 5,416,413 A | | 5/1995 | Leussler | |
| 5,437,280 A | | 8/1995 | Hussman | |
| 5,578,925 A | * | 11/1996 | Molyneaux et al. | 324/318 |
| 5,590,655 A | * | 1/1997 | Hussman | 600/426 |
| 5,602,557 A | | 2/1997 | Duerr | |
| 5,706,812 A | | 1/1998 | Strenk et al. | |
| 5,804,969 A | * | 9/1998 | Lian et al. | 324/318 |
| 6,163,717 A | | 12/2000 | Su | |
| 6,198,962 B1 | | 3/2001 | Su | |
| 6,326,789 B1 | * | 12/2001 | Yoshida et al. | 324/318 |
| 6,377,836 B1 | * | 4/2002 | Arakawa et al. | 600/422 |
| 6,493,572 B1 | * | 12/2002 | Su et al. | 600/422 |
| 6,577,888 B1 | * | 6/2003 | Chan et al. | 600/422 |

OTHER PUBLICATIONS

"Detachable RF Coil for Clinical Breast Imaging." Lian J, et al., SMR/ESMRMB (1995).

"Probe with Chest Shielding for Improved Breast MRI," Tomanek B, et al., Magnetic Resonance in Medicine 43:917–920 (2000).

"Transceive Quadrature Breast Coils and Applications at 4 Tesla," Hellmut Merkle, et al., Proceedings of the International Society for Magnetic Resonance in Medicine, p. 1114 (2001).

* cited by examiner

*Primary Examiner*—Diego Gutierrez
*Assistant Examiner*—Dixomara Vargas
(74) *Attorney, Agent, or Firm*—Michael A. Della Penna; Armstrong Teasdale LLP

(57) ABSTRACT

A RF receive coil system for imaging a breast on a human chest with a horizontal field MRI system includes a volume saddle coil adapted to be contoured about the chest; and a Helmholtz coil having a lower portion adapted to be contoured about the chest and an upper portion adapted to be above the chest The coils are operable in quadrature mode.

16 Claims, 2 Drawing Sheets

30

10

20

MRI COIL SYSTEM FOR BREAST IMAGING

CROSS-REFERENCE TO RELATED APPLICATION

This application claims the benefit of U.S. provisional patent application Ser. No. 60/308,455 filed Jul. 27, 2001.

BACKGROUND OF THE INVENTION

The present invention relates to magnetic resonance imaging (MRI) systems and, in particular, to the radio-frequency (RF) coils used in such systems.

U.S. Patent Documents:

U.S. Pat. No. 5,363,845, Breast coil for magnetic resonance imaging, Chowdhury and Boskamp U.S. Pat. No. 5,386,447, Mammographic screening and biopsy apparatus, Siczek U.S. Pat. No. 5,416,413, Magnetic resonance examination apparatus comprising a coil system for MR mammography) Leussler U.S. Pat. No. 5,437,280, Magnetic resonance breast localizer, Hussman U.S. Pat. No. 5,602,557, Mammography antenna arrangement for NMR examinations of a female breast, Duerr U.S. Pat. No. 5,804,969, MRI RF coil Lian and Roemer U.S. Pat. No. 6,163,717, Open structure breast coil and support arrangement for interventional MRI, Su U.S. Pat. No. 6,198,962B1, Quadrature detection coil for interventional MRI, Su U.S. Pat. No. 5,706,812, Stereotactic MRI breast biopsy coil and method for use, Strenk et al.

The above-cited documents and references are incorporated herein by reference.

Magnetic resonance imaging (MRI) utilizes hydrogen nuclear spins of the water molecules in a human body, which are polarized by a strong, uniform, static magnetic field generated by a main magnet (named $B_0$–the main magnetic field in MRI physics). The magnetically polarized nuclear spins generate magnetic moments in a human body. The magnetic moments point in the direction of the main magnetic field in a steady state, and produce no useful information if they are not disturbed by any excitation.

The generation of a nuclear magnetic resonance (NMR) signal for MRI data acquisition is accomplished by exciting the magnetic moments with a uniform radio frequency (RF) magnetic field (named $B_1$ field or the excitation field). The $B_1$ field is produced in the imaging region of interest by an RF transmit coil which is driven by a computer-controlled RF transmitter with a power amplifier. During excitation, the nuclear spin system absorbs magnetic energy, and its magnetic moments precess around the direction of the main magnetic field. After excitation, the precessing magnetic moments will go through a process of free induction decay (FID), releasing their absorbed energy and returning to the steady state. During free induction decay, NMR signals are detected by the use of a receive RF coil, which is placed in the vicinity of the excited volume of the human body. The NMR signal is the secondary electrical voltage (or current) in the receive RF coil that has been induced by the precessing magnetic moments of the human tissue. The receive RF coil can be either the transmit coil itself, or an independent receive RF coil. The NMR signal is used for producing images by using additional pulsed magnetic gradient fields, which are generated by gradient coils integrated inside the main magnet system. The gradient fields are used to spatially encode the signals and selectively excite a specific volume of the human body. There are usually three sets of gradient coils in a standard MRI system, which generate magnetic fields in the same direction as the main magnetic field, varying linearly in the imaging volume.

In MRI, it is desirable for the excitation and reception to be spatially uniform in the imaging volume for better image uniformity. In a standard MRI system, the best excitation field homogeneity is usually obtained by using a whole-body volume RF coil for transmission. The whole-body transmit coil is the largest RF coil in the system. A large coil, however, produces lower signal-to-noise ratio (SNR or S/N) if it is also used for reception, mainly because of its greater distance from the signal-generating tissues being imaged. Since a high signal-to-noise ratio is one of the most desirable characteristics in MRI, special-purpose coils are often used for reception to enhance the S/N ratio from the volume of interest.

In practice, a well-designed specialty RF coil should have the following functional properties: a high S/N ratio, good uniformity, high unloaded Quality factor (Q) of the resonance circuit, and a high ratio of the unloaded to loaded Q factors. In addition, the coil device should be mechanically designed to facilitate patient handling and comfort, and to provide a protective barrier between the patient and the RF electronics. Another way to increase the SNR is by quadrature reception. In this method, NMR signals are detected in two orthogonal directions, which are in the transverse plane or perpendicular to the main magnetic field. The two signals are detected by two independent coils/receivers that cover the same volume of interest. In this quadrature mode, the SNR can be increased by up to a factor of the square root of 2 over that of the individual linear coils.

Breast cancer is one of the leading causes of death in today's women. Early diagnosis of malignancy and follow-up therapy by noninvasive MRI/MRS could greatly enhance survival chances. It is also noted that biopsy or interventional applications are often performed on a female patient to treat cancer tissues or diagnose suspicious lesions within a breast. For this reason, it is desirable to design breast coils that are customized to the size and shape of individual breasts in order to obtain a maximized filling factor for the volume of interest while providing an easy and open access to breasts for a surgeon to perform biopsy/interventional procedures.

For conventional breast MRI, a whole body coil is typically used as a transmitter coil and a smaller receiver coil is utilized to receive signals from breast tissues being examined. However, a whole body coil is not necessarily optimized or customized for breast imaging, in general, since it produces a uniform excitation around the center of the coil, this usually does not coincide with the position of breasts. Another disadvantage in common with many breast coils is that they do not provide an easy and open access for a surgeon to perform biopsy/interventional procedures on a patient.

SUMMARY OF THE INVENTION

A RF receive coil system for imaging a breast on a human chest with a horizontal field MRI system includes a volume saddle coil adapted to be contoured about the chest; and a Helmholtz coil having a lower portion adapted to be contoured about the chest and an upper portion adapted to be above the chest The coils are operable in quadrature mode.

DESCRIPTION OF THE PREFERRED EMBODIMENTS

The present invention provides a customized and dedicated transceiver system for breast imaging, together with a capability to perform biopsy/interventional applications. It may be accomplished by using both a localized transmitter coil optimized for breast imaging and a customized receiver coil with open access to breast tissues under examination. The localized transmitter coil provides more uniform excitation in an examined breast region with more efficiency since it is designed for only breast imaging. In addition, the receiver coil is designed to yield high SNR and uniform sensitivity with easy access for a surgeon to perform biopsy/interventional applications.

Figure 1:
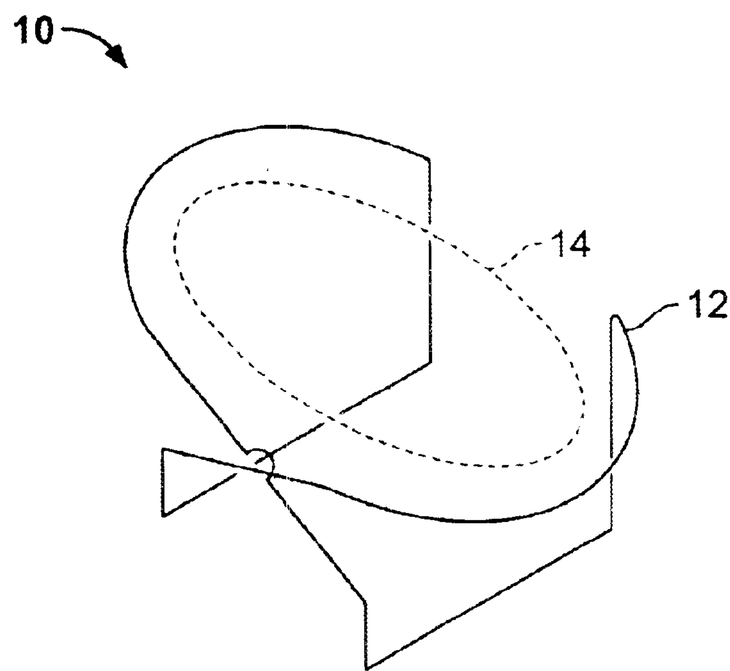
FIG. 1 is a schematic perspective view of a transmitter coil system according to the invention. Broken lines are used to indicate a separate coil rather than hidden lines.

Referring to FIG. 1, a transmit coil system 10 for breast imaging with a horizontal $B_0$ is formed from a volume saddle coil 12 (shown in solid lines) whose surface elements are contoured to a human chest and a loop coil 14 (shown in broken lines) above the human chest, which also may be contoured to the human chest. The coil 12 produces a useful $B_1$ field perpendicular to the main magnetic field $B_0$. The loop coil 14 produces a useful $B_1$ field that is orthogonal to both the $B_1$ field generated from the coil 12 and the main magnetic field $B_0$, constituting a quadrature mode transmit coil system.

Figure 2:
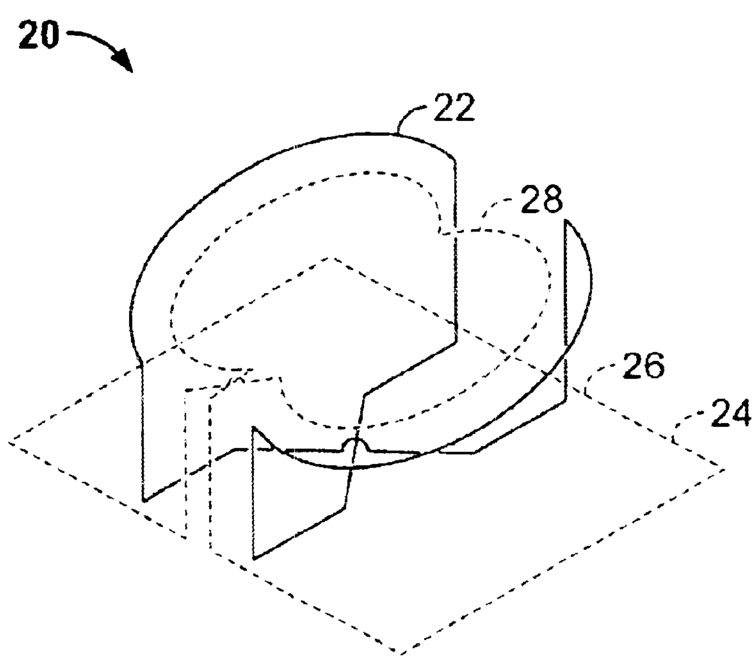
FIG. 2 is a schematic perspective views of a receive coil system according to the invention. Broken lines are used to indicate a separate coil rather than hidden lines.

Referring to FIG. 2, a receive coil system 20 for breast imaging with a horizontal $B_0$ is formed from a volume saddle coil 22 (shown in solid lines) whose surface elements are contoured to the human chest and a Helmholtz-like coil 24 (shown in broken lines), The coil 22 has a useful $B_1$ field perpendicular to the main field $B_0$. The coil 24 has a useful $B_1$ field that is orthogonal to both the $B_1$ field of the coil 22 and the main field $B_0$. The lower portion 26 of the coil 24 may also be contoured to the human chest and the upper portion 28 may be above the chest including the breasts. The coils 22, 24 constitute a quadrature mode receive coil system.

Figure 3:
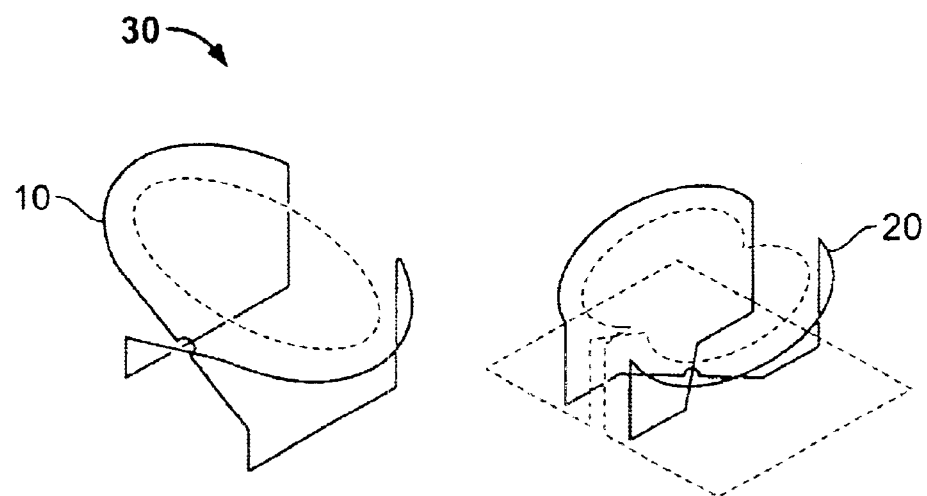
FIG. 3 is a schematic perspective view of a transmitter and receiver coil system showing exemplary comparative sizes. The smaller structure is shown removed from inside the larger structure for ease of understanding. Broken lines are used to indicate a separate coil rather than hidden lines.

Referring to FIG. 3, the coil systems 10, 20 may be advantageously combined into a RF transmit and receive coil system 30. The smaller receive coil system 10 can be located within the larger transmit coil system 20.

This configuration not only provides a high SNR and excellent uniformity, but also, the spacing and location of the conductors of the coils permits their placement in a support structure that allows apertures for easy access to the breasts by a surgeon to perform biopsy/interventional procedures.

Figure 4:
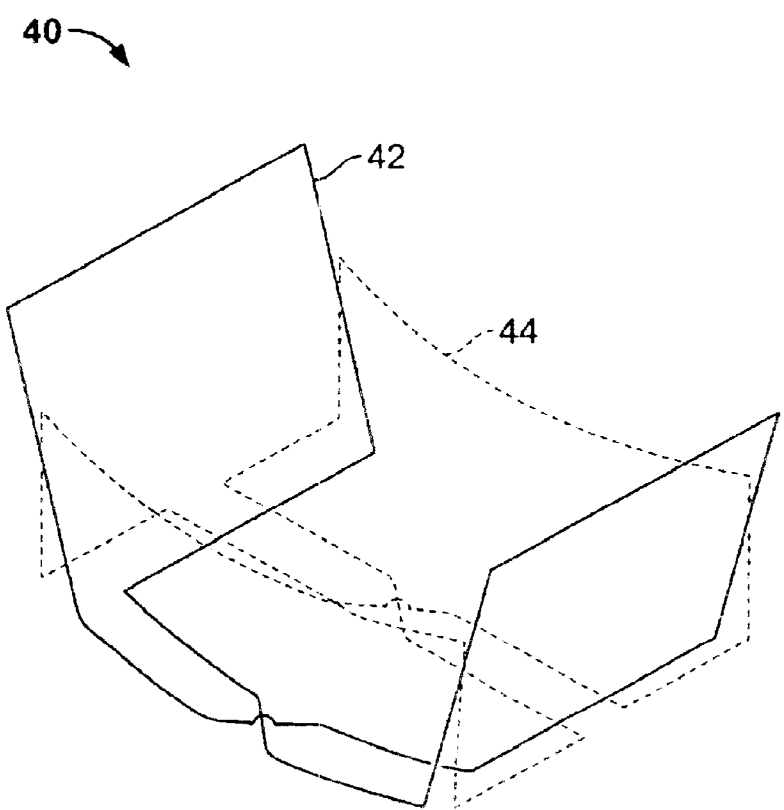
FIG. 4 is a schematic perspective view of a RF coil system according to the invention. Broken lines are used to indicate a separate coil rather than hidden lines.

1. Referring to FIG. 4, a receive (or transmit) coil system 40 for breast imaging in a vertical $B_0$ MRI system (i.e., open MRI system) is formed from a volume saddle coil 42 (shown in solid lines) whose surface elements are contoured and extended to cover lymph nodes of a human chest and a volume saddle coil 44 (shown in broken lines) which may also be contoured to a human chest. Ths col 42 produces a useful $B_1$ field perpendicular to the vertical main magnetic field $B_0$. The coil 44 produces a useful $B_1$ field that is orthogonal to both the $B_1$ field generated from the coil 42 and the field $B_0$. The coils 42, 44 constitute a quadrature mode receive (or transmit) coil. The coils 42, 45 provide a box-like imaging volume.

The coil system 40 may be used as a combined transmit/receive RF coil system or two copies of the coil system 40 may be used in combination, with one copy for reception and one copy for transmission. The coil system 40 also provides not only high SNR and uniformity but also easy access for a surgeon to perform biopsy/interventional procedures.

The coils of the invention may be placed in rigid housings or, to improve the performance further, the housing and coils may be made flexible where closer conformance to the human chest is desired.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A RF receive coil system for imaging a breast on a human chest with a horizontal field MRI system, said coil system comprising:

a volume saddle coil adapted to be contoured about said chest; and a Helmholtz-like coil having a lower portion adapted to be contoured about said chest and an upper portion adapted to be in front of said chest, said coils being operable in quadrature mode and configured to provide apertures to access said breast.

2. A RF receive coil system in accordance with claim 1 wherein said coils are configured to allow open access to breast tissues being examined.

3. A RF receive coil system in accordance with claim 1 wherein said coils are configured to allow access to perform at least one of biopsy and interventional procedures.

4. A RF receive coil system in accordance with claim 1 wherein an upper portion of said Helmholtz-like coil is configured for positioning within an upper portion of said volume saddle coil.

5. A RF transmit coil system for imaging a breast on a human chest with a horizontal field MRI system, said coil system comprising:

a volume saddle coil adapted to be contoured about said chest; and a loop coil adapted to be in front of said chest, said coils being operable in quadrature mode and configured to provide apertures to access said breast.

6. A RF transmit coil system in accordance with claim 5 wherein said coils are configured to optimize breast imaging.

7. A RF transmit coil system in accordance with claim 5 wherein said loop coil is configured for positioning within an upper portion of said volume saddle coil.

8. A RF transmit and receive coil system for imaging a breast on a human chest with a horizontal field MRI system, said coil system comprising:

a volume saddle transmit coil adapted to be contoured about said chest;

a loop transmit coil adapted to be in front of said chest, said transmit coils being operable in quadrature mode;

a volume saddle receive coil adapted to be contoured about said chest; and a Helmholtz-like receive coil having a lower portion adapted to be contoured about said chest and an upper portion adapted to be in front of said chest, said receive coils being operable in quadrature mode and configured to provide apertures to access said breast, said receive coils being located within said transmit coils.

9. A RF transmit and receive coil system in accordance with claim 8 wherein said receive coils are configured for positioning within said transmit coils.

10. A RF transmit and receive coil system in accordance with claim 8 wherein said coils are configured for positioning to form an aperture for access to breasts.

11. A RF transmit and receive coil system in accordance with claim 8 wherein said chest is positioned prone and said coils are configured to allow access to sides of the breast.

12. A RF coil system for imaging a breast on a human chest with a vertical field MRI system, said coil system comprising:

a first volume saddle coil adapted to be contoured about said chest; and a second volume saddle coil, said coils being operable in quadrature mode and forming a box-like imaging volume configured to provide apertures to access said breast.

13. A RF coil system in accordance with claim 12 where said first volume saddle coil is configured to cover lymph nodes of said chest.

14. A RF coil system in accordance with claim 12 wherein said coils are configured to transmit and receive.

15. A RF coil system in accordance with claim 12 wherein said coils are configured to perform one of transmission and reception.

16. A RF coil system in accordance with claim 12 wherein said coils are configured to allow access to perform at least one of biopsy and interventional procedures.

* * * * *